United States Patent [19]

Matsuoka

[11] Patent Number: 5,334,036
[45] Date of Patent: Aug. 2, 1994

[54] SOCKET FOR AN ELECTRIC PART

[75] Inventor: Noriyuki Matsuoka, Yokohama, Japan

[73] Assignee: Yamaichi Electronics Co., Ltd., Tokyo, Japan

[21] Appl. No.: 999,144

[22] Filed: Dec. 31, 1992

[30] Foreign Application Priority Data

Mar. 10, 1992 [JP] Japan .................................. 4-087640

[51] Int. Cl.⁵ .............................................. H01R 11/22
[52] U.S. Cl. ...................................... 439/266; 439/331
[58] Field of Search ............... 439/266, 264, 267, 269, 439/330, 331, 68, 70, 73

[56] References Cited

U.S. PATENT DOCUMENTS 4,789,345 12/1988 Carter ................................. 439/266
4,993,955 2/1991 Savant ................................. 439/331
5,186,641 2/1993 Uratsuji .............................. 439/331

FOREIGN PATENT DOCUMENTS 4-154065 5/1992 Japan .

Primary Examiner—Larry I. Schwartz
Assistant Examiner—Hien D. Vu
Attorney, Agent, or Firm—Wenderoth, Lind & Ponack

[57] ABSTRACT

Contacts are positively shifted between a contact position and a release position by an operating member. The operating member is engaged by retaining elements formed on the contacts. Projections for damping sideward movement of the contacts are formed on an engagement surface of the operating member with respect to the contacts.

6 Claims, 5 Drawing Sheets

5,334,036

SOCKET FOR AN ELECTRIC PART

BACKGROUND OF THE INVENTION

1. Field of the Invention

This invention relates to a socket for an electric part that is provided with a means for shifting contacts between a contact position and a release position.

2. Prior Art

The invention of Japanese Patent Application No. Hei 2-278461, published unexamined application No Hei 4-154055, discloses a socket including a turnable lever engageable with contacts arranged in array. In this socket, the contacts can be shifted, as a group, away from contact pieces arranged on an electric part by properly turning the turnable lever, in order to facilitate no load insertion of the electric part.

As shown in FIG. 10, however, the above conventional socket has the following problems. When the contacts 2 are repeatedly shifted by turning the lever 1 repeatedly, the contacts 2 are horizontally displaced along their engagement surfaces with respect to the lever 1, and contacting portions of the contacts are likewise displaced. As a result, a reliable contact relation with terminals of an inserted electric part is adversely affected. Moreover, if the amount of lateral displacement is significant, it gives rise to another problem, that of a short-circuit between adjacent contacts 2.

SUMMARY OF THE INVENTION

It is therefore an object of the present invention to provide a socket for an electric part in which contacts can be shifted between a contact position and a release position in a reliable manner.

According to the present invention, there is provided, in order to achieve the above object, a socket for an electric part having a plurality of contacts arranged in an array on a body of the socket and adapted to be contacted with contacting pieces on the electric part. The contacts each include a contacting portion adapted for pressure contact with a corresponding one of the contact pieces and a spring portion adapted to exert a contact pressure on the contacting portion. The socket body is provided with an operating member adapted to engage with engagement elements of the contacts so as to cause contacting portions thereof to be shifted away from the electric part against the elastic force of the spring portion of the contacting portions. The operating member is provided at contact engagement surface thereof with a plurality of projections adapted to damp the contacts.

DETAILED DESCRIPTION OF THE EMBODIMENT

One embodiment of the present invention will be described in detail with reference to FIGS. 1 through 9.

Figure 1:
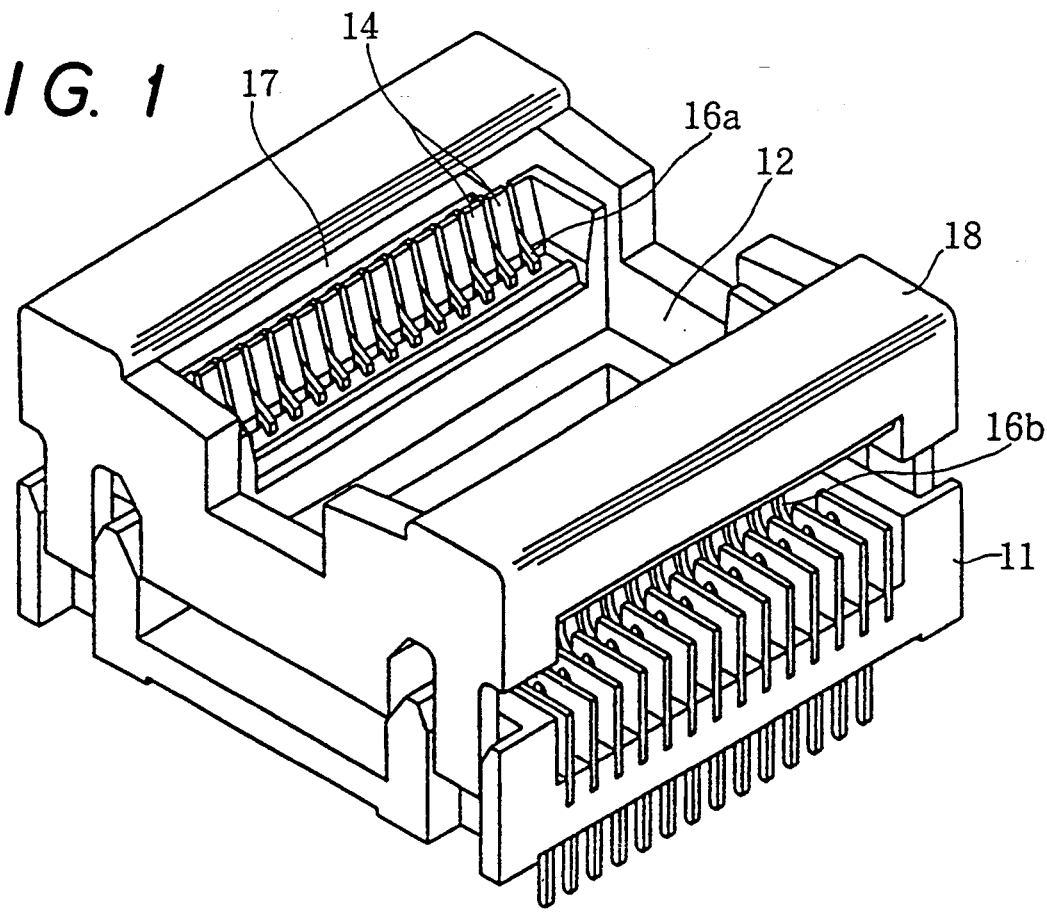
FIG. 1 is a perspective view of a socket for an electric part according to one embodiment of the present invention.
Figure 2:
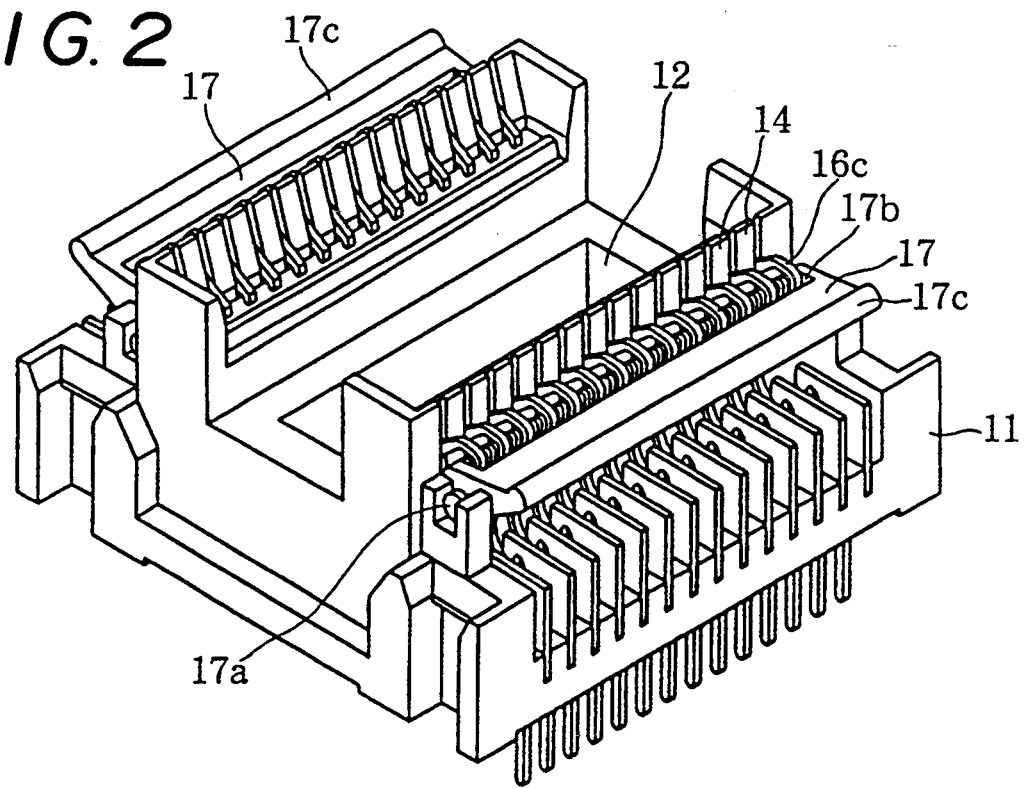
FIG. 2 is a perspective view of the socket of FIG. 1 from which a cover member has been removed, or a socket having no cover member.
Figure 3:
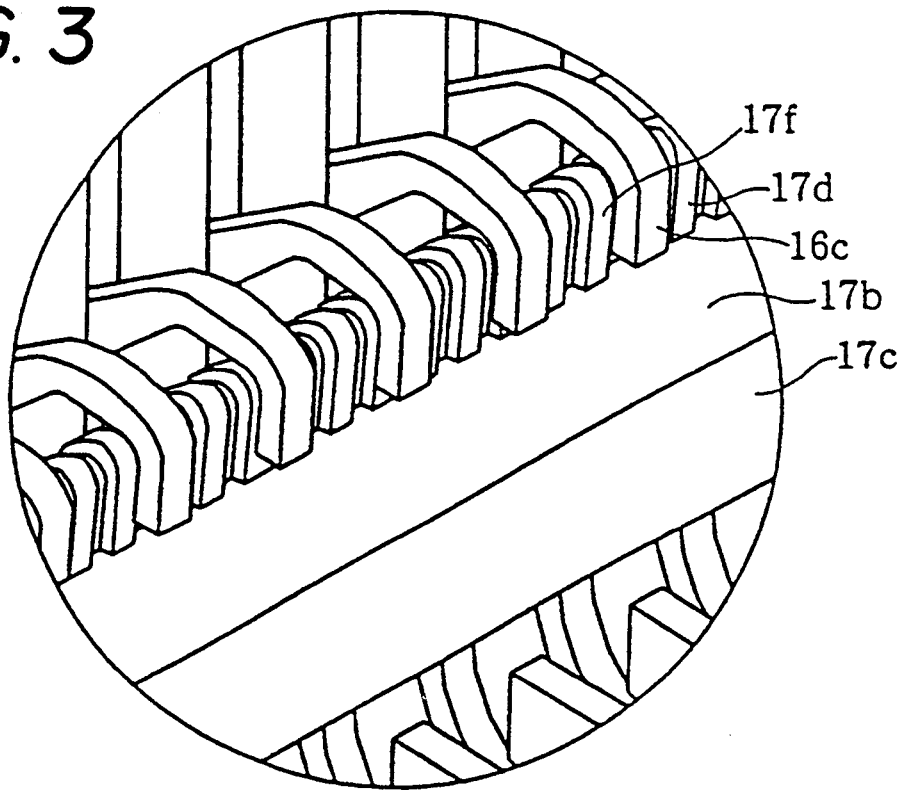
FIG. 3 is a partial circular, perspective view of the socket FIG. 1 particularly showing, on an enlarged scale, retaining elements of contacts and an engaging portion of an operating member.

As is apparent from FIGS. 1, 2, etc., a socket for an electric part has an electric part accommodation portion 12 opening to an upper surface of a base member 11, which is formed of an electric insulating material. The socket also has a lead support seat 15 located at an inner bottom of the accommodation portion 12, the lead support seat 15 being adapted to support a number of leads 13a projecting sideward from two sides or four sides of an electric part represented by an IC 13. The socket further has a number of contacts 16 arranged in an array along two sides or four sides of the accommodation portion 12.

Figure 4A:
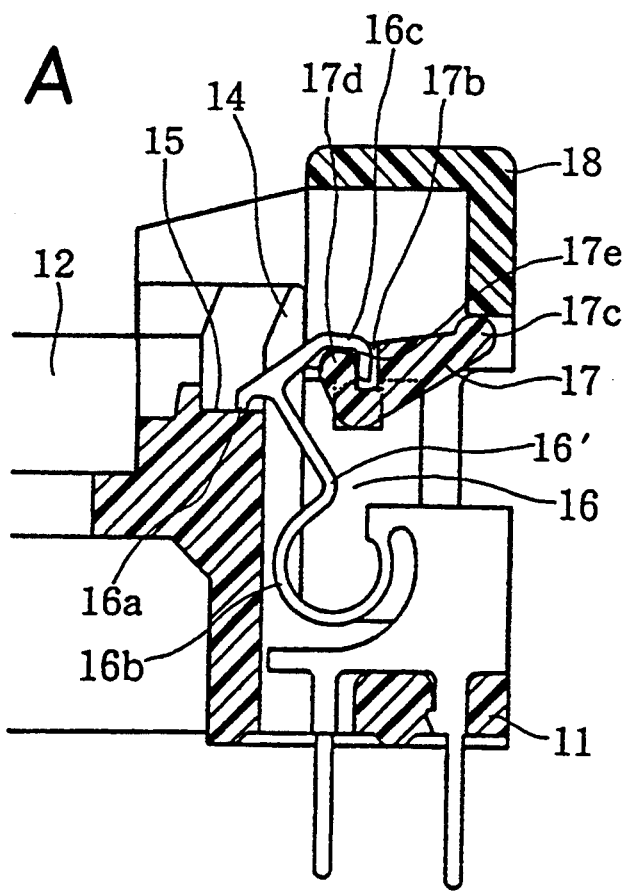
FIGS. 4A through 4C are sectional views, explaining the sequence of action of the operating member and shifting states of one of the contacts.

Each contact 16 includes a support base portion 16' having a spring portion 16b, and a contacting portion 16a formed on an upper end of the support base portion 16' and projecting inwardly therefrom. The contacting portion 16a is supported by the support base portion 16' such that the former is held in a position over the lead support seat 15. As shown in FIG. 4A, when the IC 13 is not accommodated in the accommodation portion 12, in other words when the leads 13a are not supported on the support seat 15, the support base portion 16' is shifted forwardly and inwardly together with the contacting portion 16a by the elastic force of the spring portion 16b, in order to cause the contacting portion 16a to be abutted against an upper surface of the lead support seat 15, thereby allowing the spring portion 16b to store a predetermined amount of elastic force.

Figure 4B:
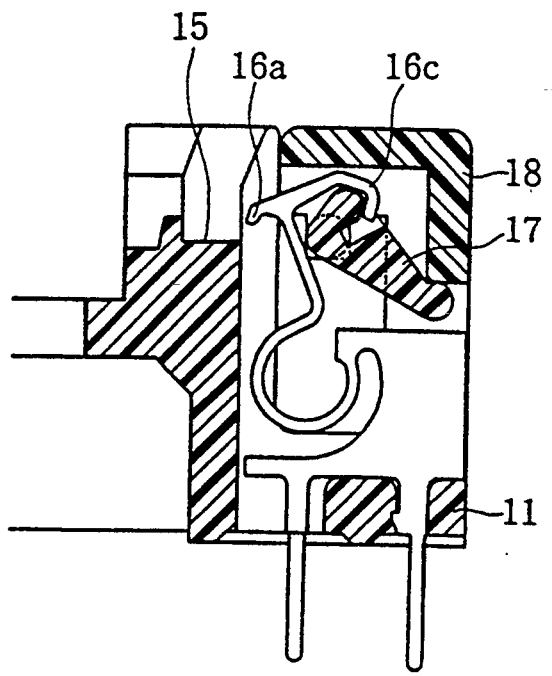
Figure 4C:
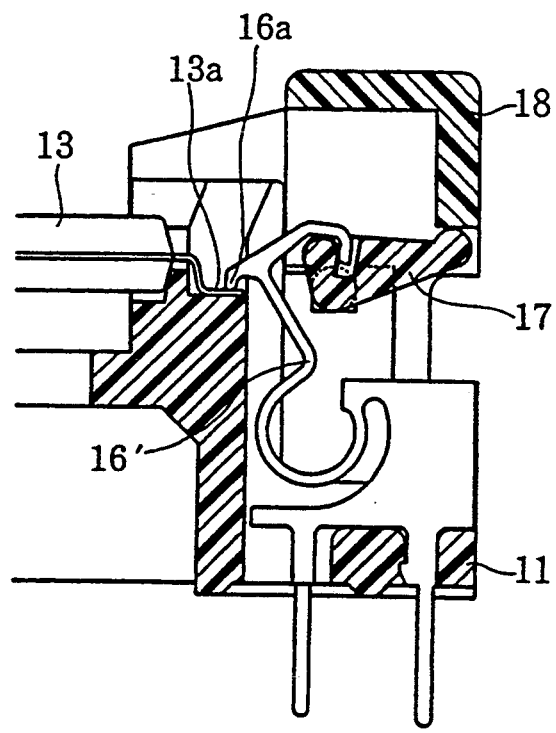

As shown in FIG. 4B, when the support base portion 16' is shifted backwardly and outwardly against the elastic force of the spring portion 16b, the contacting portion 16a is moved upwardly and laterally to a position where it will not interfere with the lead support seat 15 and the leads 13a to be supported on the seat 15. With contradicting portion 16a in state, the IC 13 is inserted into the accommodation portion 12 under no load, and the leads 13a are supported on the support seat 15. Furthermore, as shown in FIG. 4C, after the insertion of the IC into the accommodation portion 12, the support base 16' of the contact 16 is shifted inwardly by the restoring force of the spring portion 16bso that the contacting portion 16a is moved into pressure contacted with the upper surface of the lead 13a.

The socket of the present invention comprises an operating member 17 formed of an electrically insulating material as a means for shifting each contact 16 backwardly, and a cover member 18 likewise formed of an electrically insulating material as a means for activating the operating member 17. This operating member 17 is a means for applying a backward tensile force to the contacts 16. The operating member 17 is constituted by a turnable member or a reciprocating member.

FIGS. 2, 4, etc. respectively illustrate an example in which the operating member 17 comprises a turnable lever. As shown, the turnable lever forming the operating member 17 is horizontally positioned behind the support base portions 16' of the contacts 16 along the row of the contacts 16. This operating member 17 is disposed in the vicinity of an upper end of the support base portion 16' (i.e., in the vicinity of the contacting portion 16a). Shafts 17a respectively disposed at both ends of the operating member 17 are rotatably supported by the base member 11 at both ends of each row of the contacts 16. An engagement groove 17b extending parallel with each row of the contacts 16 is formed in an inner end of each operating member 17. A pressure receiving end 17c extending parallel with each row of the contacts 16 is provided on an outer end of each operating member 17.

Each contact 16 further includes a retaining element 16c in the shape of a hook member. This retaining element 16c is provided in the vicinity of the upper end of the support base portion 16'. Preferably, the retaining element 16c projects backwardly, i.e. away from accommodation portion 12, from that area of the upper end of the support base portion 16' from where the projecting portion 16a projects forwardly, i.e. toward the accommodating portion 12. Retaining element 16c is engaged in the engagement groove 17b of the operating member 17 and hooked on an acting end 17d defining the engagement groove 17b.

The retaining element 16c is contact engaged with a surface (engagement surface) of this acting end 17d. As shown in FIG. 4B, when the pressure receiving end 17c of the operating member 17 is turned downwardly from a standby position shown in FIG. 4A, in order to cause the acting end 17d to turn upwardly, a tensile force is applied to the retaining element 16c while the retaining element 16c is sliding on the engagement surface. As a result, as described hereinabove, the support base portion 16' is shifted backwardly so as to bring the contacting portion 16a into a position where the contacting portion 16a will not interfere with the corresponding lead.

On the other hand each contact 16 is shifted forwardly by the restoring force of the spring portion 16b. During the forward shifting motion of the contact 16, the retaining element 16c applies a tensile force to the acting end 17d to cause the operating member 16 to turn to the standby position shown in FIG. 4A. Then, as shown in FIG. 4C, when the operating member 16 is turned generally to the end of its turning motion, the contact 16 is pressure contacted with the upper surface of the corresponding lead 13a.

A plurality of projections 17e adapted to damp the contacts are formed on the surface (i.e. the engagement surface with which the retaining element 16c is engaged) of the acting end 17d. The projections capable of contacting an under surface of the retaining element 16c have a function of reducing the sliding resistance of the retaining element 16c, while the projections adjacent to side edges of the retaining element 16c have a function of restraining side displacement of the retaining elements 16c.

Figure 5:
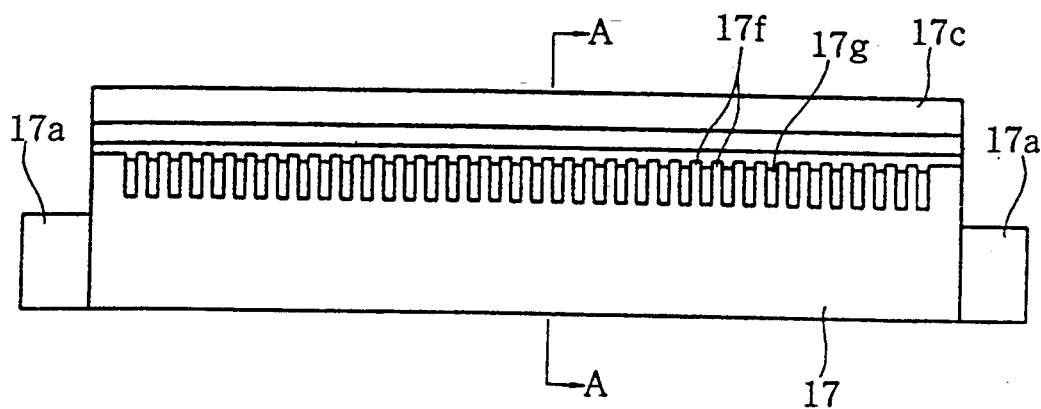
FIG. 5 is a front view of the operating member.
Figure 7:
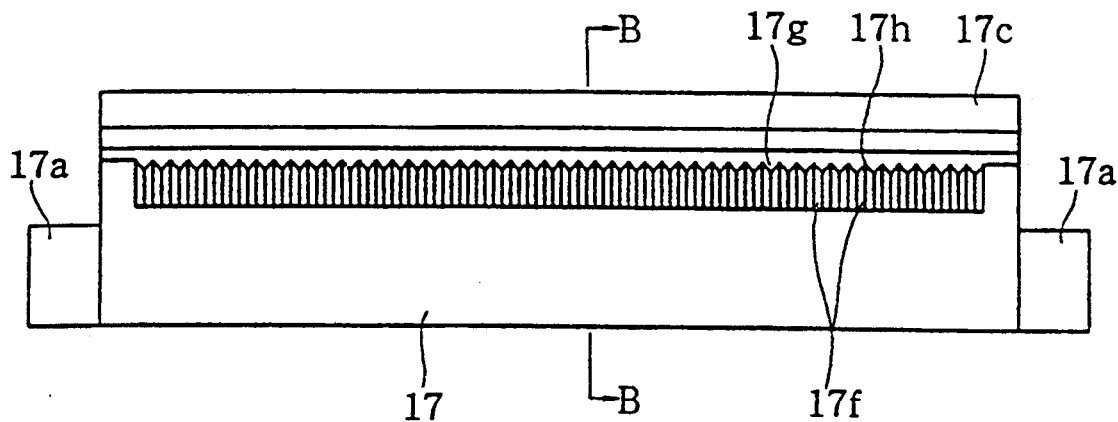
FIG. 7 a front view showing another example of an operating member.

The projections are scattered like a large number of dots, although not shown. As is apparent from FIGS. 3, 5 and 7, the projections 17e are formed of ridges 17f extending in a normal direction with respect to the shifting direction of the contacts, and the ridges 17f are arranged in parallel relation with each other. As shown in FIG. 5, a top of each ridge 17f has a flat surface in section. Alternatively, as shown in FIG. 7, each ridge 17f has a sharp ridge line at a longitudinal central portion thereof and forms a watershed with reference to this ridge line 17h.

Figure 6:
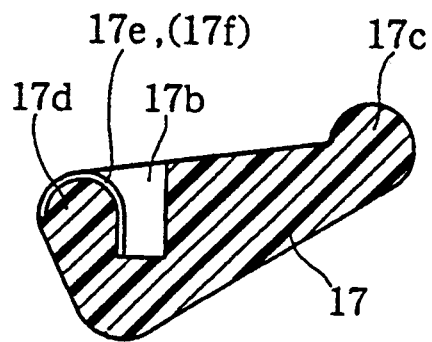
FIG. 6 is a sectional view taken on line 6—6 of FIG. 5.
Figure 8:
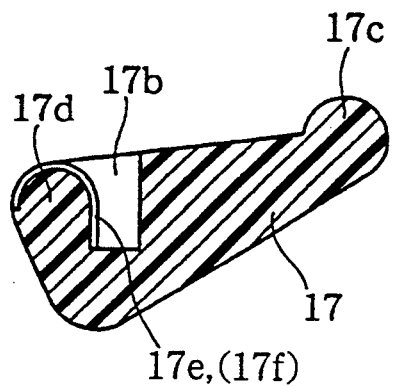
FIG. 8 is a sectional view taken on line 8—8 of FIG. 7.

As shown in FIGS. 6 and 8, the engagement surface of the acting end 17d is defined as an arcuate surface in section. The projections 17e formed of the ridges 17f are formed on this arcuate surface in order to facilitate a smooth vertical sliding of the retaining element 16c.

Figure 9:
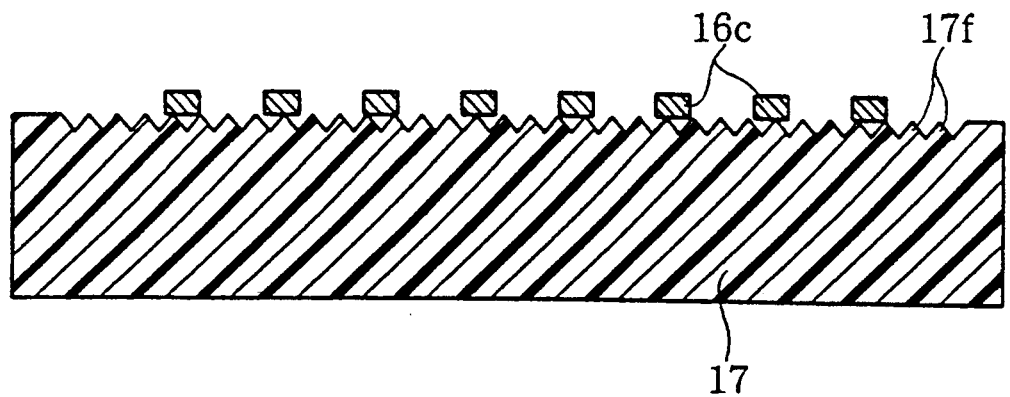
FIG. 9 is a sectional view showing a state of engagement between the operating member and the retaining elements of the contacts.
Figure 10:
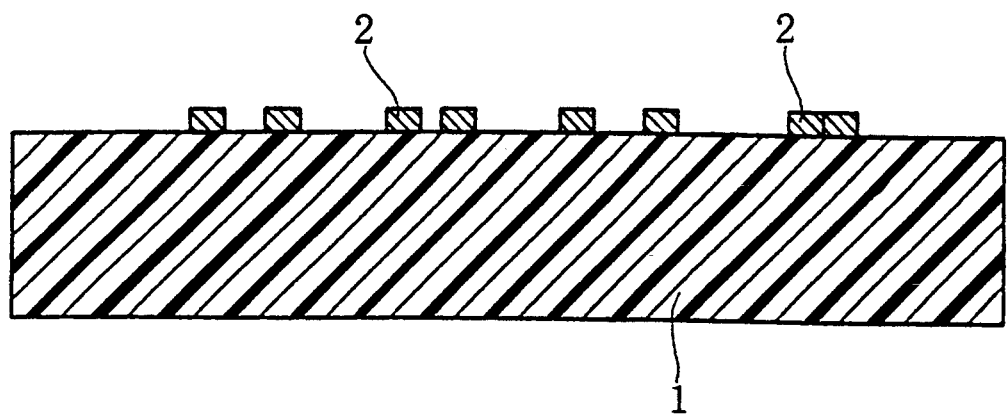
FIG. 10 is a sectional view showing a state of engagement between an operating member and retaining elements of contacts according to the prior art.

In either case, the ridges 17f are preferably arranged in parallel at spaces smaller than that between adjacent retaining elements 16c. In other words, as shown in FIG. 9, the engagement elements 16c are never dropped between adjacent ridges 17f under any circumstances, and at least a part of the retaining elements 16c are placed on the surfaces of the ridges 17h while the remaining retaining elements 16c extends over grooves 17g between adjacent ridges 17fso that when the retaining elements 16care moved sidewards, they are unavoidably limited by a longitudinal side edge or ridge line of each ridge 17f adjacent thereto i.e. the projections are spaced apart an amount smaller than the width of the retaining elements). Owing to this damping action, side displacement is restrained.

Since the ridges 17f extend in a normal direction with respect to the shifting direction of the contacts 16, the retaining elements 16c are normally oriented in a normal direction during the shifting process of the contacts 16 by the longitudinal side edge or ridge line of each ridge 17f. At the same time, the retaining elements 16c are caused to slide in a vertical direction. As a consequence, each contact 16 can be shifted forwardly and backwardly in a correct attitude. Therefore, each contact is effectively prevented from being horizontally displaced or being twisted. As a result, the operating member comes to fully exhibit its function.

As described above, the cover member 18 having an opening corresponding to the accommodation portion 12 is disposed above the base member 11 such that the cover member 18 is capable of moving upwardly and downwardly relative to the base member 11. As shown in FIG. 4B, upon depression of the cover member 18, the pressure receiving end 17c of the operating member 17 is pushed down. By this, the acting end 17d is caused to turn upwardly, the contacts are pulled, and each contacting portion 16a is caused to be separated away from the corresponding lead of the contacting portion 16a.

As shown in FIG. 4C, when the depressing force to the cover 18 is removed, the contact 16 is restored forwardly restored . Owing to this restoring force, a tensile force is applied to the acting end of the operating member 17 so as to turn the pressure receiving end 17c upwardly which, in turn, pushes up the cover member 18. During the horizontal turning process of the operating member 17, the projections as represented by the ridges 17f damp the sideward movement of the retaining elements 16c. Thus, harmful side displacement can be prevented, and the retaining elements 16c are guided to slide vertically so as to contact the corresponding leads properly.

In a modification of the invention, instead of the turnable lever, a slider (not shown) capable of reciprocating forwardly and backwardly may be used as the operating member. In that case, the retaining elements 16c can be drawn by the reciprocal motion of the slider. The pressure receiving end 17c may be turned by manual operation without using the cover member 18.

Partition walls 14 formed on the base member 11 are interposed between adjacent contacts 16 in order to isolate the individual contacts. The contacting portions 16a of the contacts are allowed to project inwardly of the partition walls 14, and the retaining elements 16c are allowed to extend outwardly of the partition walls 14. The projections 17e as represented by the ridges 17f prevent the retaining elements 16c from displacing sidewardly, the partition walls 14 restrain sideways motion of each contact 16 in the vicinity of the contacting portion 16a, and both the projections 17e and the partition walls 14 cooperate with each other in order to shift the contacts 16 in correct attitudes.

In the embodiments described above, the operating member 17 is engaged with the retaining elements 16c extending backwardly from the support base members 16' of the contacts 16. However, the present invention is not limited to this. For example, in the case where the ridges and dot-like projections are arranged on the engagement surface of the operating member 17 at spaces smaller than the pitch between adjacent contacts, the present invention is likewise applicable to at least two kinds of contacts having different pitches.

As described in the foregoing, according to the present invention, the projections as represented by the ridges formed on the engagement surface of the operating member favorably damp the sideward movement of the contacts while smoothly shifting the contacts forwardly and backwardly, thereby effectively preventing harmful side displacement and twisting, thus making it possible to obviate the problems of short-circuits between adjacent contacts and irregularity of contact positions attributable to side displacement and twisting. As a result, highly reliable contact relations are ensured. Therefore, the function of the operating element can be exhibited effectively.

What is claimed is:

1. A socket for an electric part, comprising:
   a socket body;
   a plurality of contacts arranged in an array on said socket body and adapted to be contacted with contact pieces on the electric part when the electric part is inserted into said socket body;
   each said contact having a contacting portion adapted to engage in pressure contact with a corresponding contact piece, a spring portion for exerting a contact pressure on said contact portion and a retaining element; and
   an operating member on said socket body adapted to shift said contacting portions of said contacts away from the contact pieces of the electric part against the resilient force of said spring portions, said operating member having an engagement surface with a plurality of damping projections thereon, and said retaining elements of said contacts being disposed on said damping projections of said engagement surface such that said damping projections damp movement of said retaining elements of said contacts on said operating member wherein said projections are ridges extending in a direction normal to a shifting direction of said contacts, each said ridge being a sharp tooth.

2. The socket of claim 1, wherein said ridges are arranged parallel to each other.

3. The socket of claim 1, wherein said operating member is a turnable lever.

4. The socket of claim 1, wherein said projections are spaced from each other an amount smaller than the spacing between adjacent said retaining elements.

5. The socket of claim 1, wherein each said retaining element is in contact with at least one said projection.

6. The socket of claim 1, wherein said projections are spaced apart from each other at a spacing narrower than the width of said retaining elements.

* * * * *